United States Patent
Shibuya et al.

(10) Patent No.: US 9,385,090 B2
(45) Date of Patent: Jul. 5, 2016

(54) SEMICONDUCTOR DEVICE AND METHOD OF MANUFACTURING SEMICONDUCTOR DEVICE

(71) Applicant: KABUSHIKI KAISHA TOSHIBA, Tokyo (JP)

(72) Inventors: Katsunori Shibuya, Miegun Kawgoe Mie (JP); Takashi Imoto, Kamakura Kanagawa (JP); Soichi Homma, Yokkaichi Mie (JP); Takeshi Watanabe, Yokkaichi Mie (JP); Yuusuke Takano, Yokkaichi Mie (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/475,270

(22) Filed: Sep. 2, 2014

(65) Prior Publication Data
US 2015/0171020 A1 Jun. 18, 2015

(30) Foreign Application Priority Data
Dec. 13, 2013 (JP) ................................ 2013-258493

(51) Int. Cl.
H01L 21/56 (2006.01)
H01L 23/552 (2006.01)
H01L 25/00 (2006.01)
H01L 23/31 (2006.01)
H01L 21/78 (2006.01)
H01L 25/065 (2006.01)

(52) U.S. Cl.
CPC .......... *H01L 23/552* (2013.01); *H01L 23/3128* (2013.01); *H01L 25/0655* (2013.01); *H01L 25/50* (2013.01); *H01L 21/561* (2013.01); *H01L 2224/48091* (2013.01); *H01L 2224/48227* (2013.01)

(58) Field of Classification Search
CPC .............. H01L 23/552; H01L 23/3107; H01L 25/0655; H01L 25/50
See application file for complete search history.

(56) References Cited

U.S. PATENT DOCUMENTS 8,018,033 B2   9/2011  Moriya
8,084,300 B1 * 12/2011  San Antonio ......... H01L 21/561
                                             257/E21.602

(Continued)

FOREIGN PATENT DOCUMENTS

JP        3417388       6/2003
JP     2012039104 A     2/2012

OTHER PUBLICATIONS

Taiwan Office Action dated Jan. 21, 2016, filed in Taiwan counterpart Patent Application No. 103121260, 8 pages (with English translation).

*Primary Examiner* — Peniel M Gumedzoe
(74) *Attorney, Agent, or Firm* — Patterson & Sheridan, LLP

(57) ABSTRACT

A semiconductor device includes a conductive shield layer that has a first portion covering a surface of a sealing resin layer and a second portion covering side surfaces of the sealing resin layer and side surfaces of the substrate. Portions of wiring layers, including a grounding wire, on or in the substrate have cut planes which are exposed to the side surfaces of the substrate and spread out in a thickness direction of the substrate. A cut plane of the grounding wire is electrically connected to the shield layer. An area of the cut plane of the grounding wire is larger than an area of a cross section of the grounding wire parallel to, and inward of the substrate from, the cut plane of the grounding wire.

11 Claims, 9 Drawing Sheets

(56) References Cited

U.S. PATENT DOCUMENTS

| | | | |
|---|---|---|---|
| 2010/0157545 A1* | 6/2010 | Lehtimaki | H05K 1/0218 361/728 |
| 2010/0207259 A1* | 8/2010 | Liao | H01L 21/6835 257/660 |
| 2010/0230789 A1 | 9/2010 | Yorita et al. | |
| 2011/0186993 A1* | 8/2011 | Kobayashi | H01L 21/4832 257/737 |
| 2012/0168214 A1* | 7/2012 | Kashiwagi | H01L 23/3121 174/257 |

* cited by examiner

SEMICONDUCTOR DEVICE AND METHOD OF MANUFACTURING SEMICONDUCTOR DEVICE

CROSS-REFERENCE TO RELATED APPLICATION

This application is based upon and claims the benefit of priority from Japanese Patent Application No. 2013-258493, filed Dec. 13, 2013, the entire contents of which are incorporated herein by reference.

FIELD

Embodiments described herein relate generally to a semiconductor device and a method of manufacturing the semiconductor device.

BACKGROUND

In a semiconductor device used in a portable communication device, leakage of electromagnetic energy from the semiconductor device needs to be suppressed to prevent interference with the communication characteristics of the portable device. Therefore, a semiconductor package including an electromagnetic shield is applied over the active semiconductor components of the device. An example of a shielded semiconductor package is packaging including a conductive shield layer provided along outside surfaces of a sealing resin layer that seals semiconductor chips mounted on a substrate.

DETAILED DESCRIPTION

Embodiments provide a semiconductor device that may decrease the leakage of extraneous electromagnetic wave, and a method of manufacturing the semiconductor device.

In general, according to one embodiment, a semiconductor device includes a substrate which has wiring layers including a grounding wire and on which pad electrodes are provided. The semiconductor device includes semiconductor chips mounted on the substrate. The semiconductor device includes bonding wires that electrically connect the semiconductor chips and the pad electrodes. The semiconductor device includes a sealing resin layer which is provided on an upper surface of the substrate so that the semiconductor chips and the bonding wires are sealed therein. The semiconductor device includes a conductive shield layer that has an upper portion provided to cover the upper surface of the sealing resin layer and side portions provided to cover side surfaces of the sealing resin layer and side surfaces of the substrate.

In the embodiments, end portions of the wiring layers at the cut edge of the wiring substrate have a cut plane where the dicing saw has passed therethrough in the thickness direction of the wiring board substrate during singulation of semiconductor devices from a wiring board substrate, and at which the ends of the wiring layers are exposed to the side surfaces of the substrate. The cut plane of the grounding wire, located among the cut planes of the wiring layers, is then electrically connected to the shield layer. The area of the cut plane of the grounding wire is larger than an area of a cross section of the grounding wire parallel to the cut plane of the grounding wire, i.e., the cross sectional area of the grounding wire immediately inward of the location of the cut plane is smaller than that of the grounding wire it the edge of the substrate, where the dicing saw has stretched or smeared the grounding wire material such that it is spread over adjacent surfaces of the wiring substrate cut from a wiring board substrate.

Hereinafter, embodiments are described with reference to the drawings. Further, in the embodiments described below, upper and lower directions of a substrate indicate relative directions when the surface of the substrate on which a semiconductor chip(s) are mounted is the top, which may be different from the upper and lower directions according to the gravitational acceleration.

In addition, according to the embodiments described below, an example of a semiconductor device (semiconductor package) is shown configured as a Ball Grid Array (BGA), but the semiconductor device (semiconductor package) may also be configured as a Land Grid Array (LGA) in the same manner.

(First Embodiment)

Figure 1:
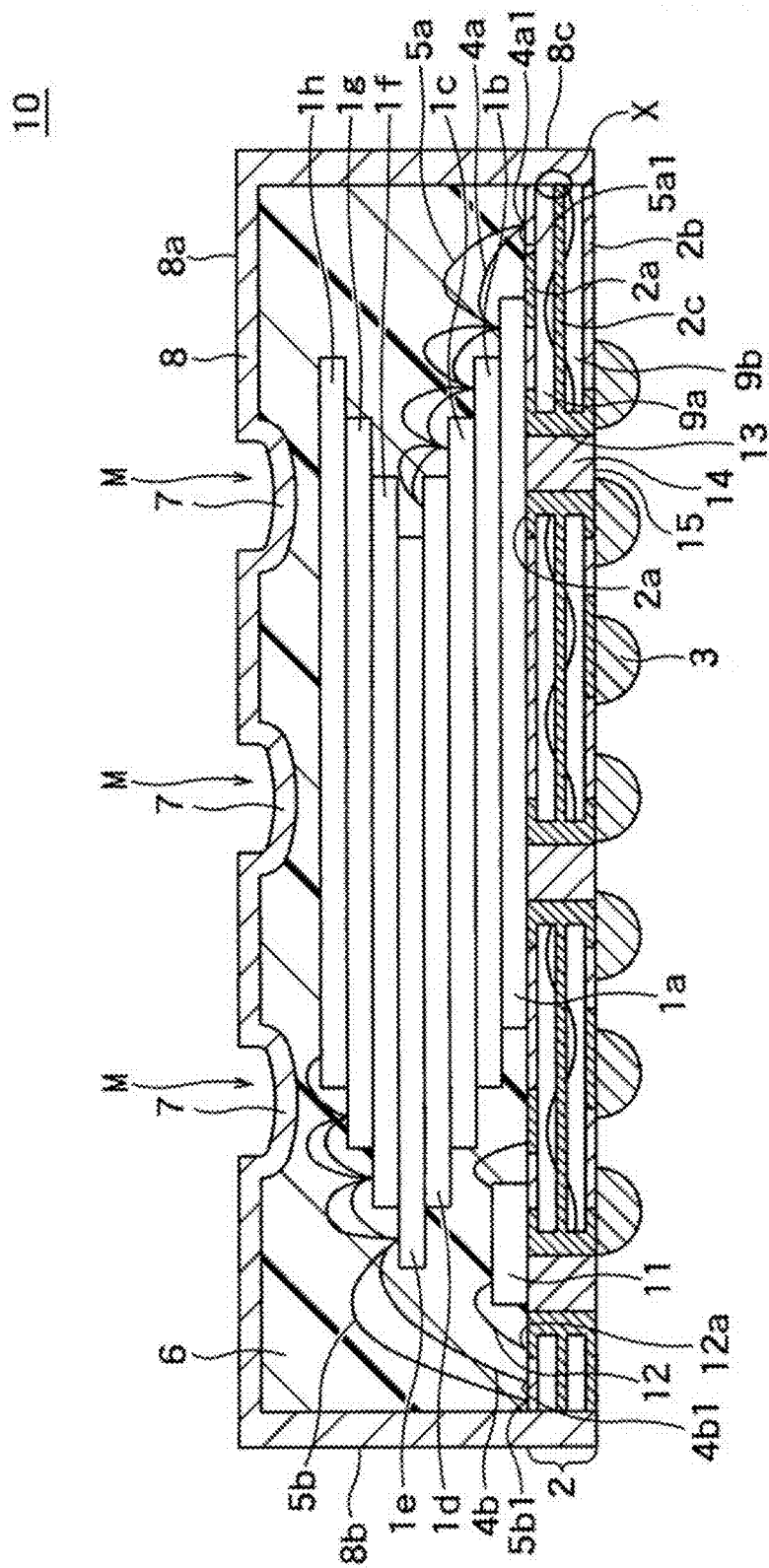
FIG. 1 is a cross sectional view illustrating an example of a configuration of a semiconductor device according to a first embodiment.

FIG. 1 is a cross sectional view illustrating an example of a configuration of a semiconductor device 10 according to a first embodiment.

As illustrated in FIG. 1, the semiconductor device 10 includes a substrate 2, an external connection terminal 3, semiconductor chips 1a to 1h and 11, bonding wires 4a, 4b, 5a, 5b, and 12, a sealing resin layer (molded resin) 6, and a conductive shield layer 8.

The substrate 2 has wiring layers including a grounding wire. Pad electrodes 4a1, 4b1, 5a1, 5b1, and 12a which are electrically connected to the wiring layers are provided on the upper surface of the substrate 2. Furthermore, a signal wire, a grounding wire, and the like of the wiring layer are provided on the upper surface of the substrate 2 (not illustrated).

For example, as illustrated in FIG. 1, the wiring layers of the substrate 2 include a first wiring layer 2a, a second wiring layer 2b, and a third wiring layer 2c.

The first wiring layer 2a is provided on the upper surface of the substrate 2, and electrically connected to each of the pad electrodes.

The second wiring layer 2b is provided on the lower surface of the substrate 2.

Figure 2:
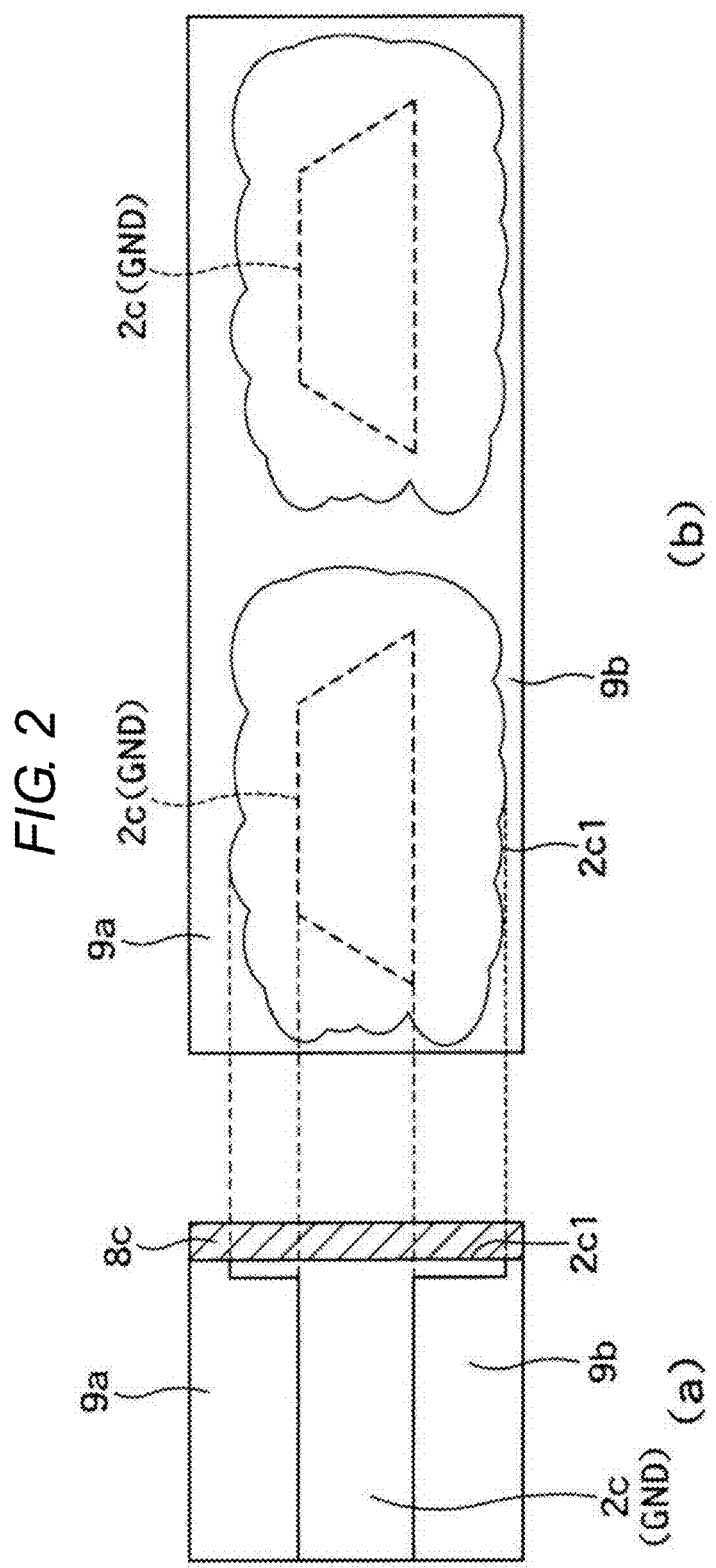
FIGS. 2(a) and 2(b) are cross sectional views illustrating an example of a cross section and a cut plane of a wiring layer in the vicinity of a region X of the semiconductor device illustrated in FIG. 1.

The third wiring layer 2c is provided within, and extends across the substrate, between the first wiring layer 2a and the second wiring layer 2b. The third wiring layer 2c may include one or more generally planar traces or thin lines of a conductive material, which extend within the wiring substrate 2 at least from the right end to the left end of the wiring substrate as shown in FIG. 2, but may also extend inwardly and outwardly of the page of FIG. 2 to the cut ends extending between the cut ends at the left and right ends of the substrate 2 in FIG. 2. Accordingly, portions (end portions) of the third wiring layer 2c have a cut, generally planar, surface, hereinafter the cut plane, which is exposed at the side surfaces of the substrate 2 by cutting the substrate 2 in the thickness direction thereof. Further, as described below, the cut plane of the third wiring layer 2c extend over portions of the side surfaces created by cutting the substrate 2 using a dicing saw.

Further, in the example of FIG. 1, the grounding wire is provided as the third wiring layer 2c. The grounding wire uses, for example, a metal material. Accordingly, for example, any one of gold, silver, copper, aluminum, nickel, palladium, and tungsten is used as the metal material.

In addition, the substrate 2 further includes a first insulating layer 9a and a second insulating layer 9b.

The first insulating layer 9a is provided between the first wiring layer 2a and the third wiring layer 2c.

The second insulating layer 9b is provided between the second wiring layer 2b and the third wiring layer 2c.

In addition, the substrate 2 includes via holes 15 that extend through the substrate 2 to electrically connect the wiring layers 2a, 2b, and 2c. Each of the via holes 15 includes a conductive layer 13 formed on the inner surface of a via hole 15 that extends through the substrate 2 and a filling material 14 with which a hollow portion within the envelope of the conductive layer 13 is filled.

The semiconductor chips 1a to 1h are mounted on the upper surface of the substrate 2.

Here, the semiconductor chips 1a to 1h are, for example, sequentially stacked on the upper surface of the substrate 2 as illustrated in FIG. 1. The lowermost positioned semiconductor chip 1a is disposed on the upper surface of the substrate 2 using a solder resist layer (not illustrated) so as to be bond, but electrically isolate, the underside of semiconductor chip 1a with respect to the upper surface if the substrate 2.

The semiconductor chips 1a to 1e are electrically connected to the pad electrodes 4a1 and 5a1 by the bonding wires 4a and 5a. In addition, the semiconductor chips 1f to 1h are electrically connected to the pad electrodes 4b1 and 5b1 by the bonding wires 4b and 5b.

The semiconductor chips 1a to 1h are, for example, NAND-type flash memories.

In addition, the semiconductor chip 11 is disposed on the upper surface of the substrate 2 with a solder resist layer (not illustrated) interposed therebetween to secure, but isolate, the underside of the semiconductor chip 11 from the upper surface of substrate 2. The semiconductor chip 11 is electrically connected to the pad electrode 12a by the bonding wire 12.

The semiconductor chip 11 is, for example, a NAND-type flash memory controller.

In addition, the sealing resin layer 6 is provided on the upper surface of the substrate 2 and over the semiconductor chips disposed thereon so as to seal the semiconductor chips 1a to 1h and 11 and the bonding wires 4a, 4b, 5a, 5b, and 12 therewithin.

Concave portions 7 are formed on the upper surface of the sealing resin layer 6.

The shield layer 8 is provided on the surface of the sealing resin layer 6. The shield layer 8 is conductive. The shield layer 8 includes, for example, an upper portion 8a provided to cover the upper surface of the sealing resin layer 6, and the side portions 8b and 8c provided to cover the side surfaces of the sealing resin layer 6 and the side surfaces of the substrate 2 as illustrated in FIG. 1.

Accordingly, the cut plane of the third wiring layer 2c forming the grounding wire is electrically connected to the inner facing surface of the side portion 8c of the shield layer 8.

In addition, with respect to the shield layer 8, identification marks M having the concave form of the concave portions 7 of the sealing resin layer 6 are formed on the upper portion 8a by the conformal forming of the shield layer 8 on the sealing resin layer 6.

Here, since at least a portion of extraneous electromagnetic energy (waves) emitted from the semiconductor chips 1a to 1h and 11 or the wiring layers of the substrate 2 are insulated from the exterior or the semiconductor device 10 by the sealing resin layer 6 and the shield layer 8 that covers side surfaces of the substrate 2, the leakage of electromagnetic energy to the area outside of the sealing resin layer 6 and shield layer 8 is suppressed.

The shield layer 8 is preferably formed of a metal layer that has low resistivity in order to suppress the leakage of the extraneous electromagnetic energy (waves) emitted from the wiring layers of the substrate 2 or the semiconductor chips 1a to 1h and 11 in the sealing resin layer 6. Therefore, a metal layer including, for example, copper, silver, or nickel or combinations thereof may be selected as the shield layer 8.

In addition, the external connection terminal 3 is provided on the lower surface of the substrate 2, and electrically connected to the wiring layer (the second wiring layer 2b) in the substrate 2. The external connection terminal 3 is, for example, a plurality of solder balls connected to individual wiring layer 2b contact portions.

Further, the aforementioned grounding wire formed of the third wiring layer 2c is electrically connected to an electrical ground exterior to the semiconductor device 10 through one of the solder balls or other terminal structures of the external connection terminal 3, thus also connecting the shield layer 8 to ground.

According to this, extraneous electromagnetic energy (waves) is transmitted to electrical ground, and thus leakage of the extraneous electromagnetic energy through the sealing resin layer 6 and shield layer 8 may be suppressed.

Here, FIGS. 2(a) and 2(b) are cross sectional views illustrating an example of a cross section and a cut plane of a wiring layer in the vicinity of a region X (lower right corner) of the semiconductor device 10 illustrated in FIG. 1. FIG. 2(a) is a cross sectional view illustrating the vicinity of the region X of FIG. 1. FIG. 2(b) is a cross sectional view illustrating a boundary between the substrate 2 and the side portion 8c of the shield layer 8 in the region X of FIG. 1 when viewed from the side portion 8c of the shield layer 8. In addition, through two grounding wires GND are shown in FIG. 2 (b), three or more grounding wires GND may be provided, or only one wide grounding wire GND extending across, or nearly across, the depth direction of the substrate 2 of FIG. 1. may be provided within the substrate 2 as the third wiring layer 2c.

Portions (end portions) of the third wiring layers 2c (the grounding wires GND) each have a cut plane 2c1 which includes the surface of the third wiring layer 2c which is cut when individual semiconductor devices 10 are singulated from a single wiring board substrate, which cut planes 2c1 are exposed on the side surfaces of the substrate 2 and extend in the thickness direction of the substrate 2 as illustrated in FIGS. 2(a) and 2(b). Accordingly, the cut plane of the grounding wire GND is connected to the side portion 8c of the shield layer 8 (FIG. 2(a)) when the shield layer 8 is formed thereover. That is, the shield layer 8 and the grounding wire GND are electrically connected to each other at the cut plane 2c1 of the grounding wire GND.

As a result of the rubbing of the dicing saw against the relatively ductile, as compared to the composition of the wiring board 2 and sealing resin 6, wiring 2c material, the size of the cut plane of the grounding wire GND is larger than the size of the cross section of the grounding wire GND parallel to the cut plane immediately inwardly of the end of the wiring substrate 2 therefrom at (the inner surface of the side portion 8c of the shield layer 8) (FIGS. 2(a) and 2(b)). This enhances the connection state between the shield layer 8 and the grounding wire GND because the surface area of connection therebetween is increased. That is, it is possible to decrease the contact resistance between the shield layer 8 and the grounding wire GND. According to this, it is possible to further decrease the leakage of the extraneous electromagnetic energy (waves).

Figure 3:
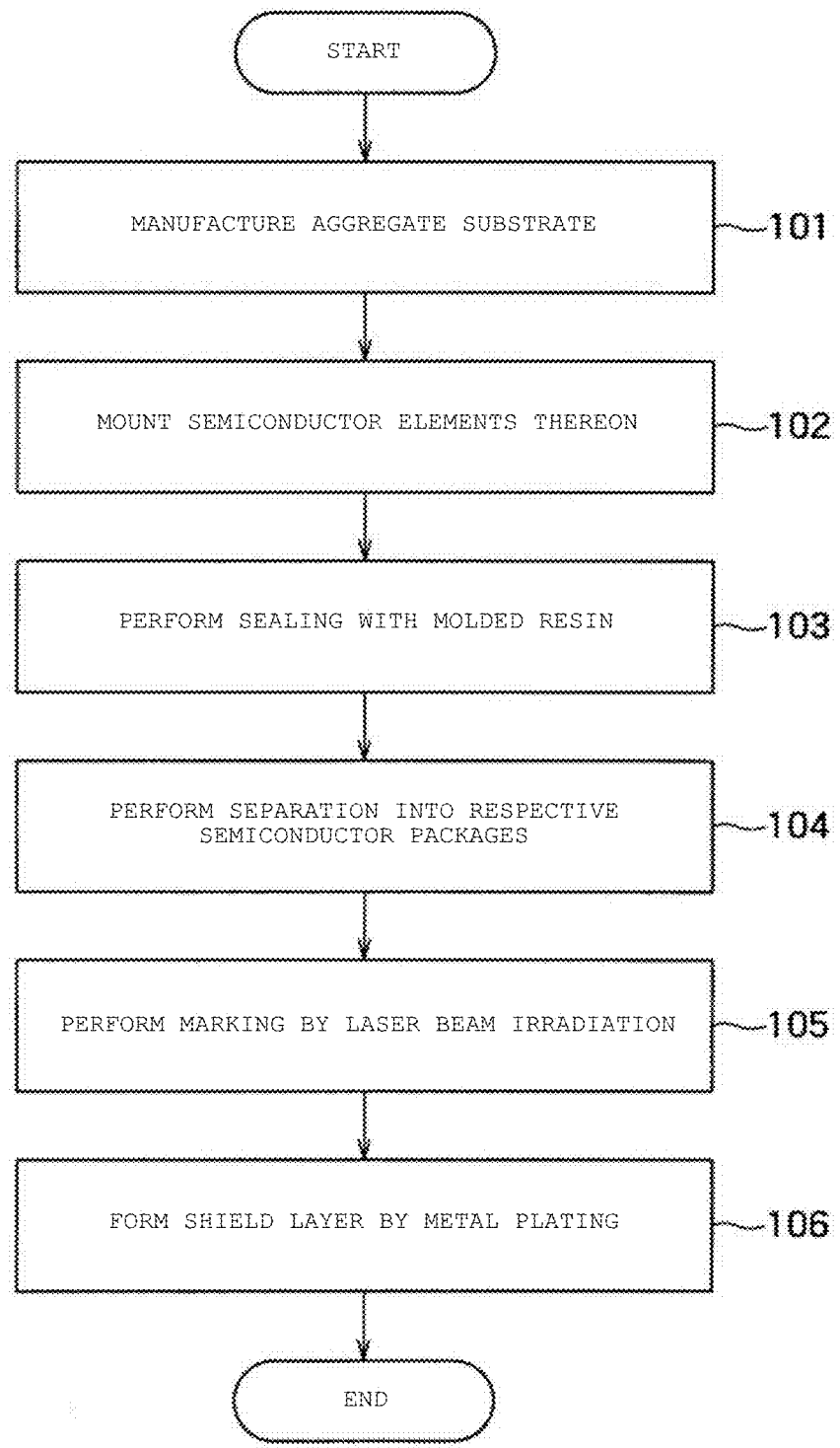
FIG. 3 is a flowchart illustrating an example of processes of the method of manufacturing the semiconductor device illustrated in FIG. 1.

Hereinafter, an example of a method of manufacturing the semiconductor device 10 having the configuration as set forth above is described. FIG. 3 is a flowchart illustrating an example of processes of the method of manufacturing the semiconductor device 10 illustrated in FIG. 1. In addition, FIGS. 4(a) and 4(b) are cross sectional views illustrating an example of a cross section of a wiring layer before the substrate 2 is cut. In addition, FIGS. 5(a) and 5(b) are cross sectional views illustrating an example of across section and a cut plane of the wiring layer after the substrate 2 is cut from a wiring board substrate. Further, FIG. 4(a) and FIG. 5(a) illustrate a region corresponding to the region of the wiring layer illustrated in (a) of FIG. 2. In addition, FIG. 4(b) and FIG. 5(b) illustrate a region corresponding to the region of the wiring layer illustrated in FIG. 2 (b).

As illustrated in the steps set forth in FIG. 3, an aggregate substrate including a plurality of substrates 2 which have wiring layers including grounding wires and pad electrodes thereon is manufactured in Step 101.

Subsequently, semiconductor elements are mounted on a wiring board substrate in Step 102, which will be singulated into individual substrates 2 in step 104. Accordingly, the semiconductor chip 11 and the pad electrode 12a are electrically connected to each other by the bonding wire 12. Thereafter, the semiconductor chips 1a to 1d are mounted (stacked). Accordingly, the semiconductor chips 1a to 1d and the pad electrodes 4a1 and 5a1 are electrically connected to each other through the bonding wires 4a and 5a. Thereafter, the semiconductor chips 1e to 1h are mounted (stacked). Accordingly, the semiconductor chips 1e to 1h and the pad electrodes 4b1 and 5b1 are electrically connected to each other through the bonding wires 4b and 5b.

Subsequently, the semiconductor elements on the substrates are sealed by the sealing resin layer (molded resin) 6 in Step 103. That is, the sealing resin layer 6 is formed on each of the substrates 2 to seal the semiconductor chips 1a to 1h and 11, and bonding wires 4a, 4b, 5a, 5b, and 12 from the external environment.

Subsequently, the substrate 2, together with the wiring layer is cut by a dicing saw and thus separated (singulated) into the semiconductor devices (semiconductor packages) 10 in Step 104.

Figure 4:
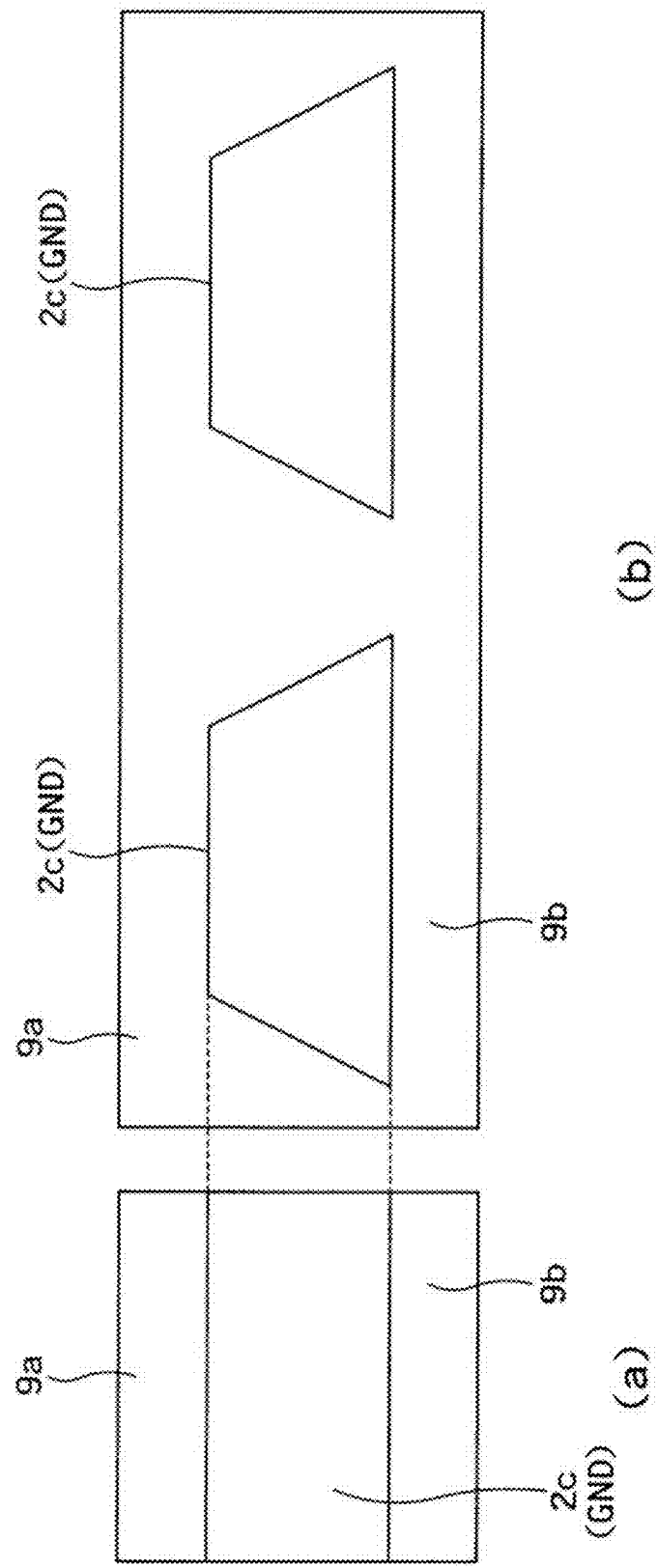
FIGS. 4(a) and 4(b) are cross sectional views illustrating an example of a cross section of a wiring layer before a substrate is cut.
Figure 5:
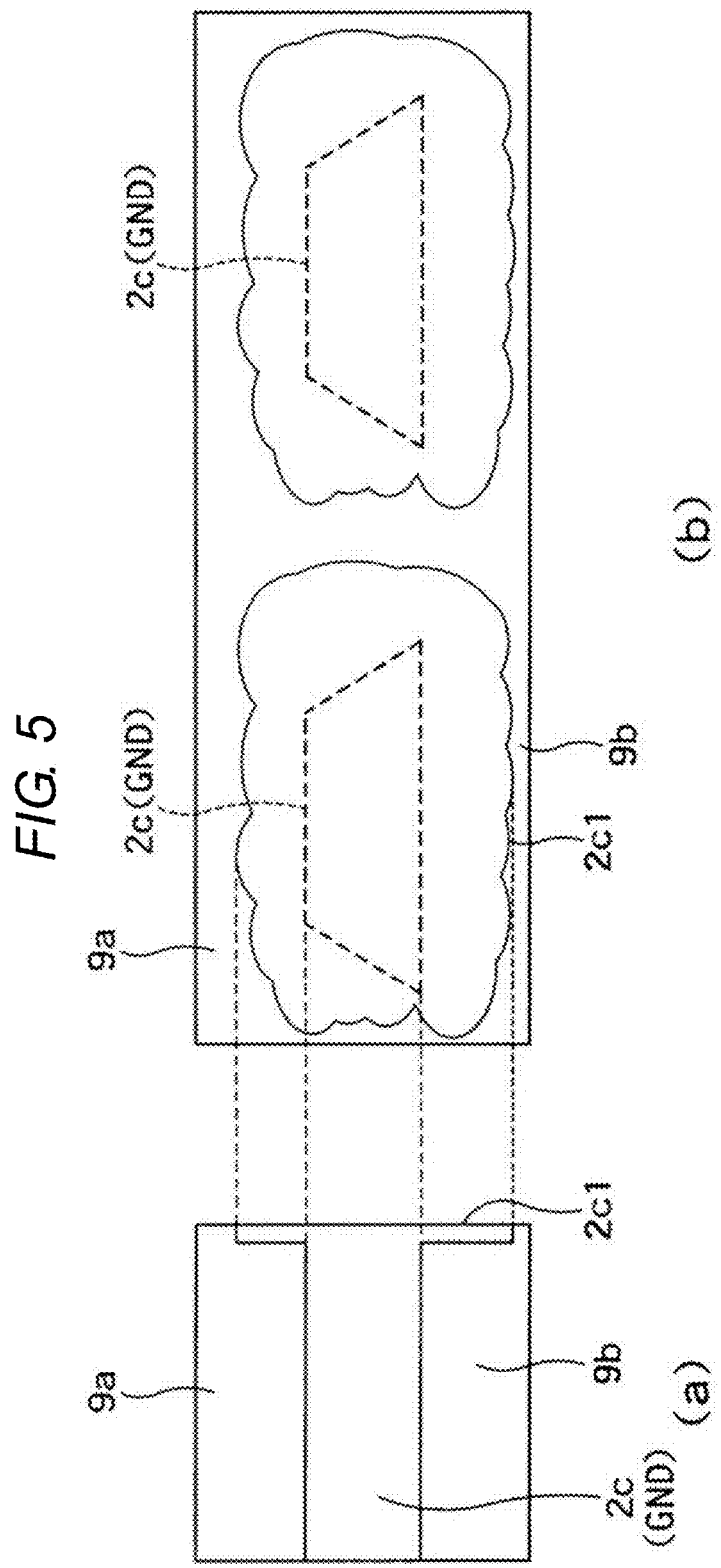
FIGS. 5(a) and 5(b) are cross sectional views illustrating an example of a cross section and a cut plane of the wiring layer after the substrate is cut.

As illustrated in FIGS. 5(a) and 5(b), the size of the cut plane 2c1 of the third wiring layer 2c (the grounding wire GND) formed by the cutting by the dicing saw is larger than the size of the cross section of the grounding wire GND before the cutting (FIGS. 4(a) and 4 (b)).

Cutting the grounding wire GND by the dicing saw so that the size of the cross section of the grounding wire GND after the cutting thereof is larger than that before the cutting may be achieved by adjusting the cutting condition of the cutting speed, the number of times required for the cutting (cutting once, or step-cutting in two or more steps), or the like in addition to adjusting diameters (sizes) of abrasive grains of the dicing blade, the width of the blade, and the material of the blade.

Subsequently, marking is performed on the upper surface of the sealing resin layer 6 by laser beam irradiation (the concave portions 7 are formed) in Step 105.

Subsequently, the shield layer 8 is formed by metal plating or the like in Step 106.

That is, for example, a method of forming a copper film, a nickel film, or the like by electroless plating or electroplating, or a method of forming a copper film or the like by sputtering is applied to form the conductive shield layer 8 so that the upper surface of the sealing resin layer 6 is covered and also the side surfaces of the sealing resin layer 6 and the side surfaces of the substrate 2 are covered. Accordingly, the shield layer 8 shows the identification marks M which are concave in the pattern of the concave portions 7 on the upper surface of the sealing resin layer 6 on the upper portion 8a.

Here, as described above, the size of the cut plane 2c1 of the grounding wire GND becomes larger than that of the cross section of the grounding wire GND parallel to the cut plane of the grounding wire GND (the inner surface of the side portion 8c of the shield layer 8) (FIGS. 5(a) and 5(b)).

Therefore, it is possible to enhance the connection state between the shield layer 8 and the grounding wire GND. That is, it is possible to decrease the contact resistance between the shield layer 8 and the grounding wire GND. According to this, it is possible to further decrease the leakage of the extraneous electromagnetic wave.

Further, the shield layer 8 may be formed by coating a conductive paste on the sealing resin 6 and the exposed cut sides of the substrate 2 by, for example, a transfer method, a screen printing method, a spray coating method, a jet dispense method, an inkjet method, or an aerosol method. In this case, the conductive paste desirably includes, for example, copper or silver, and a resin, as main components, and has low resistivity.

In this manner, it is possible to decrease the leakage of the extraneous electromagnetic energy (waves) in the semiconductor device according to the present embodiment.

(Second Embodiment)

In the first embodiment described above, the grounding wire of the wiring layer is described to be configured with the main wire portion only.

In the second embodiment, the grounding wire of the wiring layer is configured to include the main wire and further include a protecting metal film enclosing at least a portion of the main wire, the protecting metal film having high resistance to oxidation. Further, the overall configuration of the semiconductor device according to the second embodiment is the same as that of the semiconductor device 10 according to the first embodiment illustrated in FIG. 1. In addition, the processes of the method of manufacturing the semiconductor device according to the second embodiment is the same as those illustrated in FIG. 3.

Here, FIGS. 6(a) and 6(b) are cross sectional views illustrating another example of a cross section and a cut plane of the wiring layer 2c in the vicinity of the region X of the semiconductor device 10 illustrated in FIG. 1.

As illustrated in FIGS. 6(a) and 6(b), the grounding wire GND included as the third wiring layer 2c includes a main wire 2cx and a protecting metal film 2cy overlying the main wire 2cx.

The main wire 2cx is comprised of a first metal material. The first metal material is selected from, for example, any one of silver, copper, aluminum and tungsten or combinations thereof.

The protecting metal film 2cy is provided to cover the main wire 2cx. Specifically, the protecting metal film 2cy covers the upper surface and the side surfaces of the main wire 2cx.

The protecting metal film 2cy is comprised of a second metal material having higher resistance to oxidation than the first metal material. The second metal material is selected from, for example, any one of gold, nickel, titanium, palladium, and platinum or combinations thereof, and the second metal material is more ductile than the first metal material.

Figure 6:
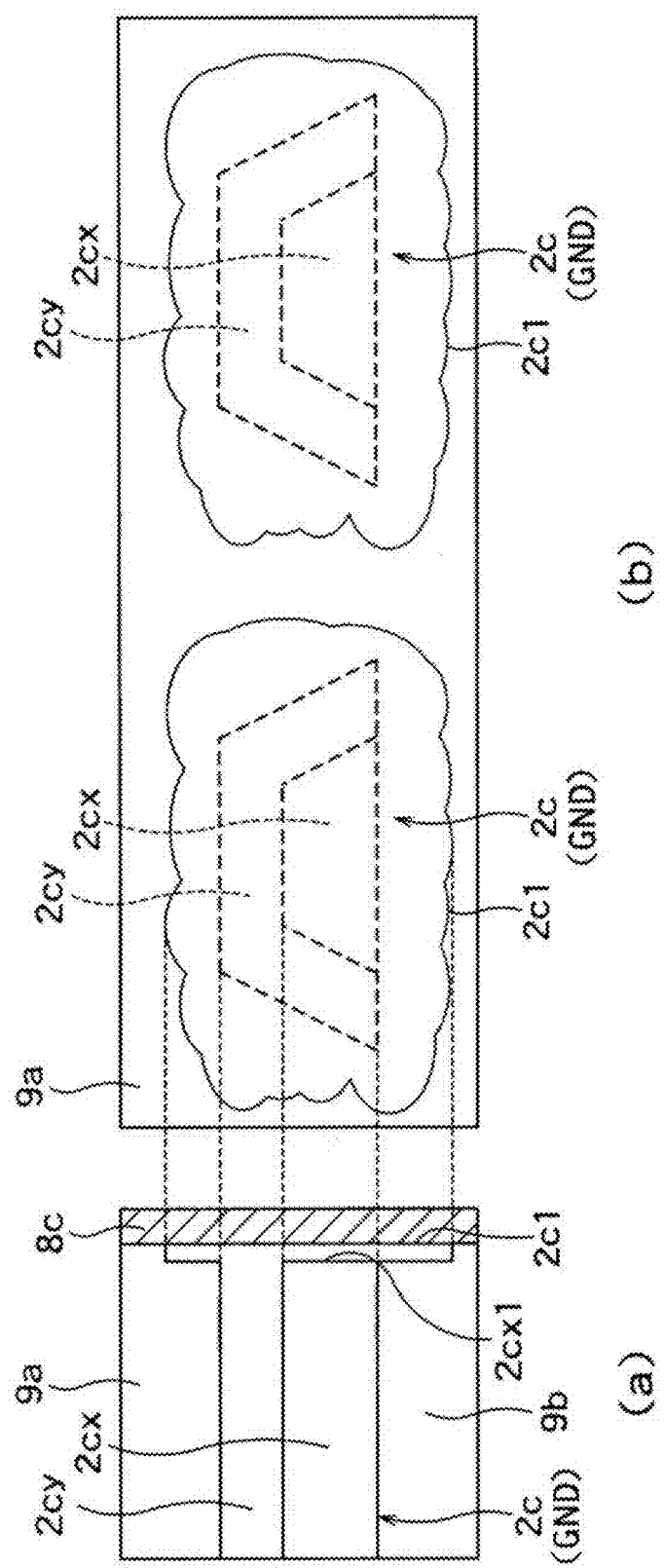
FIGS. 6(a) and 6(b) are cross sectional views illustrating another example of a cross section and a cut plane of the wiring layer in the vicinity of the region X of the semiconductor device illustrated in FIG. 1.

Here, in the cut plane 2c1 of the third wiring layer 2c (the grounding wire GND), a cut plane 2cx1 of the main wire 2cx is covered with the protecting metal film. 2cy (FIG. 6 (a)). That is, the cut plane 2cx1 of the main wire 2cx is electrically connected to the side portion 8c of the shield layer 8 through the protecting metal film 2cy.

Further, as described above, the cut plane of the third wiring layer 2c is an end surface of the third wiring layer obtained by cutting the substrate 2 with the dicing saw. The protecting metal film 2cy is stretched or smeared when the substrate 2 is cut by the dicing saw, and it is thereby spread over and covers the cut plane 2cx1 of the main wire 2cx and adjacent surfaces of the cut end surface of the substrate as illustrated in FIGS. 6(a) and 6(b). Additionally, as in the first embodiment, the material of the main wire 2cx may also become spread or smeared over the cut end portion of the substrate 2, with the stretched or smeared portion of the protecting metal film 2cy stretched or smeared thereover.

Figure 7:
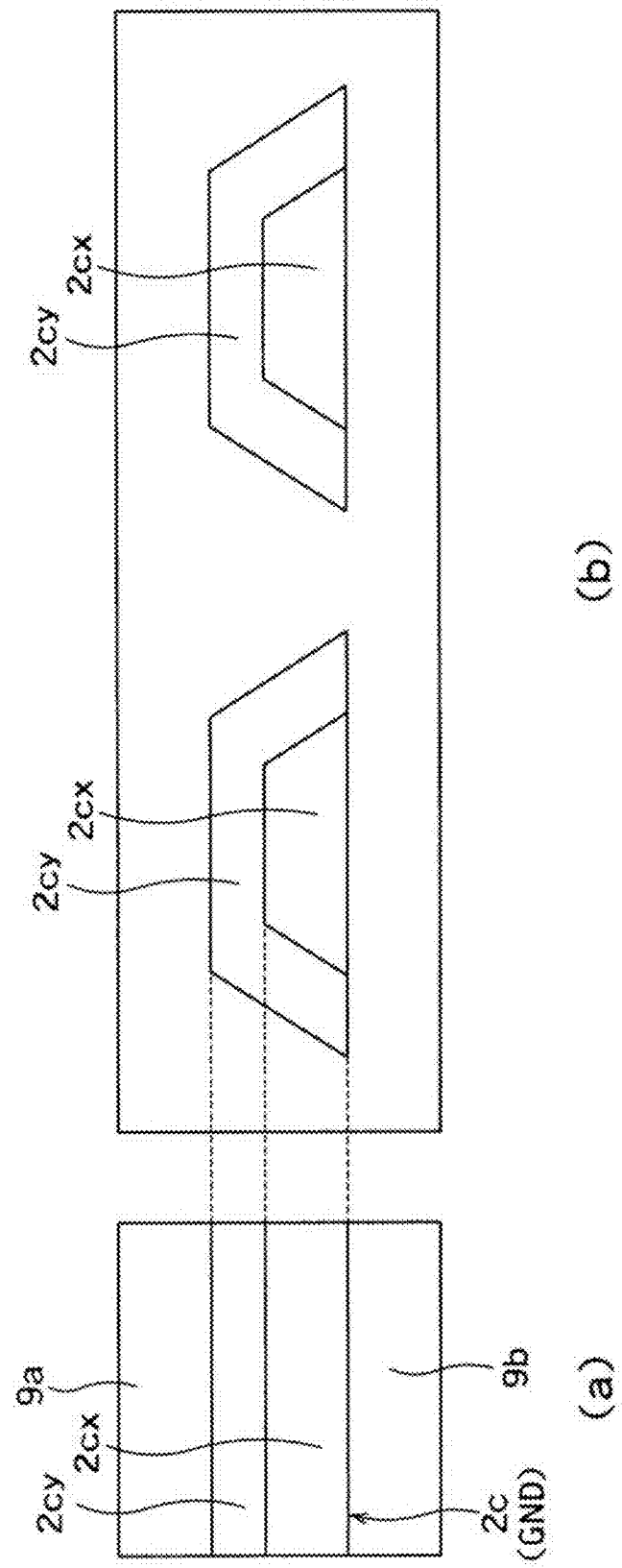
FIGS. 7(a) and 7(b) are cross sectional views illustrating another example of a cross section of the wiring layer before the substrate is cut.
Figure 8:
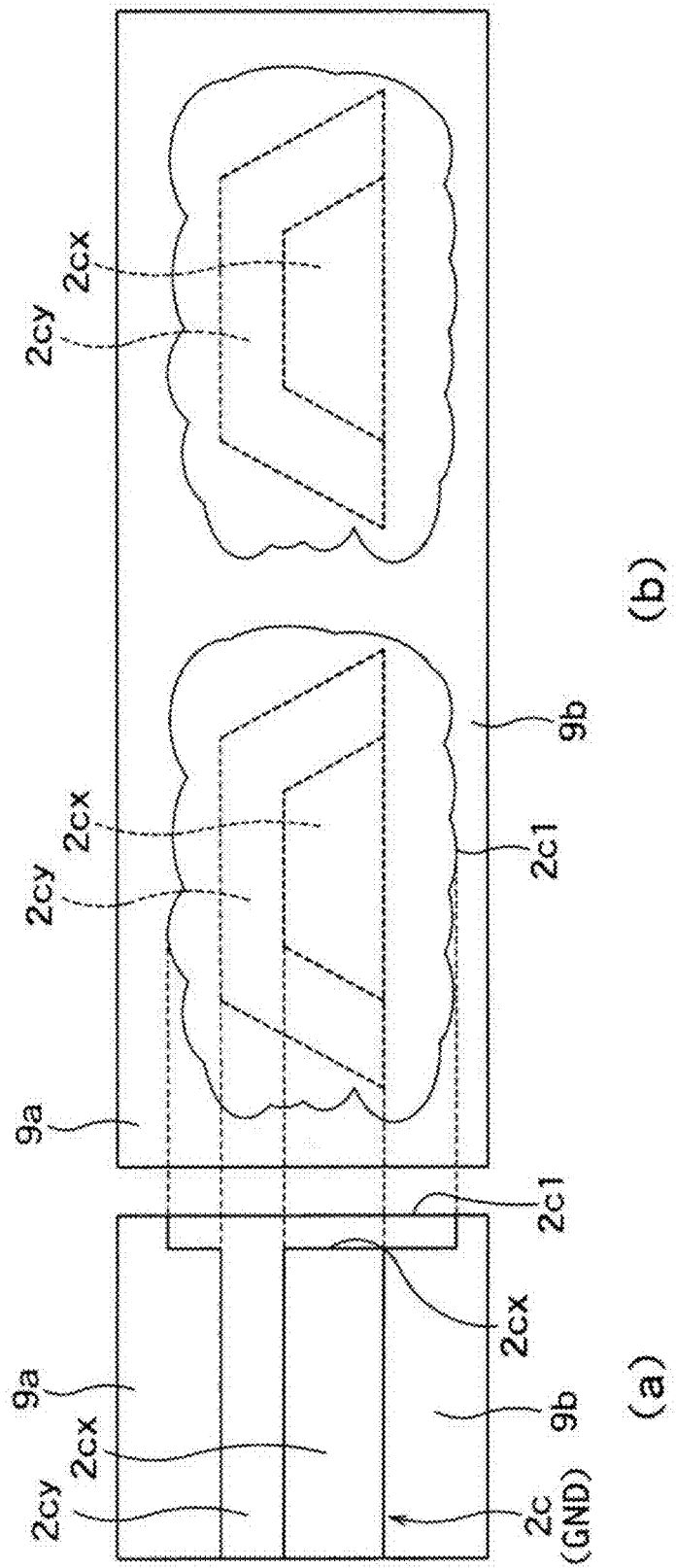
FIGS. 8(a) and 8(b) are cross sectional views illustrating another example of a cross section and a cut plane of the wiring layer after the substrate is cut.

Subsequently, an example of a method of manufacturing the semiconductor device 10 having the configuration described above is described. FIGS. 7(a) and 7(b) are cross sectional views illustrating another example of a cross section of the wiring layer before the substrate 2 is cut. In addition, FIGS. 8(a) and 8(b) are cross sectional views illustrating another example of a cross section and a cut plane of the wiring layer after the substrate 2 is cut. Further, FIG. 7(a) FIG. 8(a) illustrate regions corresponding to the region of the wiring layer illustrated in FIG. 2(a). In addition, FIG. 7(b) and FIG. 8(b) illustrate regions corresponding to the region of the wiring layer illustrated in FIG. 2(b).

As illustrated in FIG. 3, Steps 101 to 103 are performed in the same manner as the first embodiment.

Accordingly, the a wiring board substrate is cut together with the wiring layers by the dicing saw and thus individual substrates 2 are separated (singulated) therefrom to yield the semiconductor devices (semiconductor packages) 10 without the shield layer 8 yet formed thereon in Step 104.

Here, as illustrated in FIGS. 8(a) and 8(b), the size of the cut plane 2c1 of the third wiring layer 2c (the grounding wire GND) formed by cutting the substrate 2 by the dicing saw is larger than that of the cross section of the grounding wire GND before the cutting thereof (FIGS. 7(a) and 7(b)).

Accordingly, the protecting metal film 2cy is stretched or smeared over the adjacent cut surfaces of the substrate 2 and main wire 2cx1 when the substrate 2 is cut by the dicing saw and thus is spread over, and covers the cut plane 2cx1 of the main wire 2cx and adjacent cut surfaces of the substrate 2 as illustrated in FIGS. 8(a) and 8(b). That is, the cross section of the main wire 2cx formed by the dicing saw has a form of being covered with a metal material having high resistance to oxidation.

Figure 9:
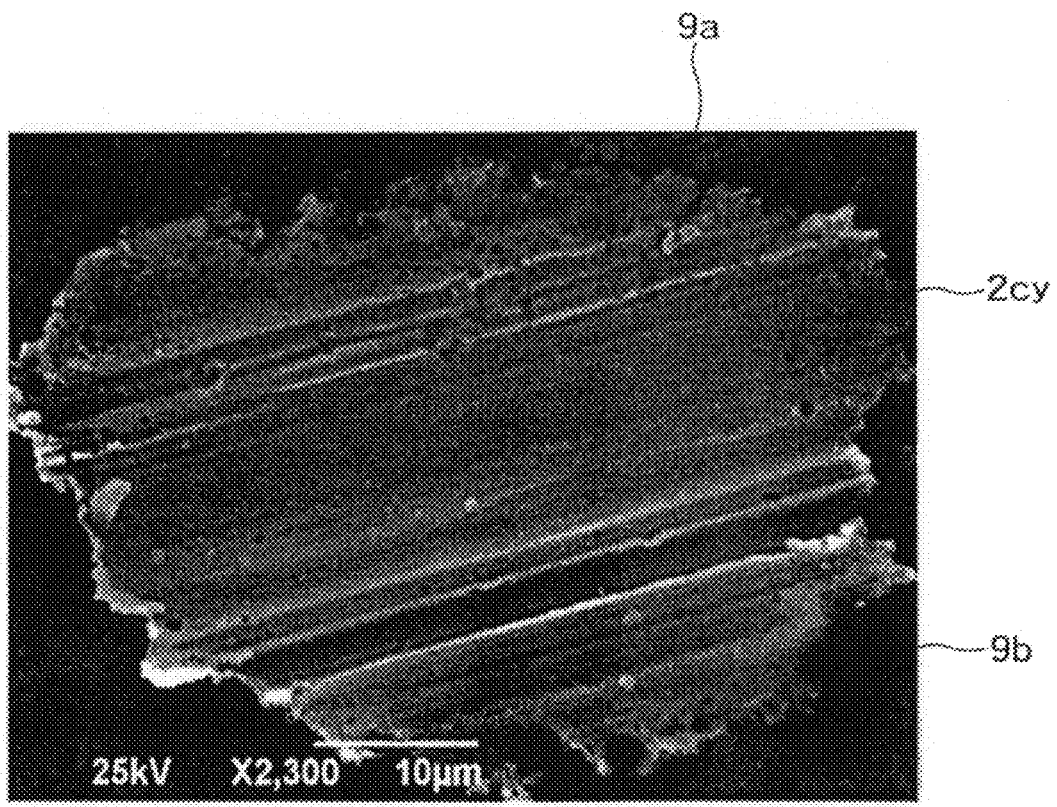
FIG. 9 is a diagram illustrating an SEM image of the cut plane of the wiring layer.

Here, FIG. 9 is a diagram illustrating an SEM image of the cut plane of the wiring layer. Further, in FIG. 9, the first metal material that configures the main wire 2cx is Cu, and the second metal material that configures the protecting metal film 2cy is Ni.

As illustrated in FIG. 9, the cross section of the third wiring layers 2c formed by the dicing saw has a form of being covered with the protecting metal film 2cy having high resistance to oxidation.

In this manner, after the dicing, until the shield layer 8 is formed and while the singulated wiring substrate 2 are exposed to atmospheric ambient conditions, the cross section of the main wire 2cx which is formed by the dicing saw may be protected against corrosion (oxidation).

Subsequently, marking is performed (the concave portions 7 are formed) on the upper surface of the sealing resin layer 6 by laser beam irradiation in Step 105.

Subsequently, the shield layer 8 is formed by metal plating or the like in Step 106.

That is, for example, a method of forming a copper film, a nickel film, or the like by electroless plating or electroplating, or a method of forming a copper film or the like by sputtering is used to form the conductive shield layer 8 so that the upper surface of the sealing resin layer 6 is covered and also the side surfaces of the sealing resin layer 6 and the side surfaces of the substrate 2 are covered. Accordingly, the shield layer 8 copies the identification marks M which in the pattern of the underlying concave portions 7 on the upper surface of the sealing resin layer 6 on the upper portion 8a.

Here, as described above, the size of the cut plane 2c1 of the grounding wire GND is larger than that of the cross section of the grounding wire GND parallel to the cut plane of the grounding wire GND (the inner surface of the side portion 8c of the shield layer 8 (FIGS. 8(a) and 8(b)).

Therefore, it is possible to enhance the connection state between the shield layer 8 and the grounding wire GND. That is, it is possible to decrease the contact resistance between the shield layer 8 and the grounding wire GND. According to this, it is possible to further decrease the leakage of the extraneous electromagnetic wave.

In this manner, it is possible to decrease leakage of electromagnetic energy (waves) in the semiconductor device according to the present embodiment.

Further, in the embodiments described above, especially with respect to FIG. 1, the electric connection between the ground wire of the third wiring layer 2c and the side portion 8c of the shield layer 8 is enhanced.

However, with respect to FIG. 1, the electrical connection between the grounding wire of the third wiring layer 2c and the side portion 8b on the opposite side of the shield layer 8 is described in the same manner. Furthermore, the electrical connection between the grounding wire of the third wiring layer 2c and two side portions (not illustrated) of the shield layer 8 parallel to the paper surface of FIG. 1 is described in the same manner.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a substrate comprising a plurality of wiring layers including at least one grounding wire, a plurality of pad electrodes on a surface thereof, and cut side surfaces;
one or more semiconductor chips provided on the substrate;
external connection terminals provided on an external surface of the substrate;
a sealing resin layer on an upper surface of the substrate on which the semiconductor chips are provided, the sealing resin layer encapsulating the semiconductor chips and adjacent areas of the substrate; and
a conductive shield layer covering the sealing resin layer and the cut side surfaces of the substrate,
wherein portions of the wiring layers have cut planes which are exposed at one side of the cut side surfaces of the substrate including a cut plane of the grounding wire, which is electrically connected to the shield layer, and
an area of the cut plane of the grounding wire is larger than an area of a cross section of the grounding wire parallel to the cut plane at a location of the grounding wire inward of the one of the cut side surfaces of the substrate,
wherein the grounding wire includes a main wire that is formed of a first metal material, and a protective metal film that is formed of a second metal material having higher resistance to oxidation than the first metal material, the second metal material contacting at least a portion of the main wire, and
wherein at the cut plane of the grounding wire, a cut plane of the main wire is covered with the protective metal film.

2. The device according to claim 1,
wherein the cut plane of the main wire is electrically connected to a portion of the shield layer through the protective metal film.

3. The device according to claim 1,
wherein the protective metal film covers an upper surface and a side surface of the main wire at the location of the grounding wire inward of a cut side surface of the substrate.

4. The device according to claim 1,
wherein the second metal material is more ductile than the first metal material.

5. The device according to claim 1, wherein in the area where the cut plane of the grounding wire is larger than an area of a cross section of the grounding wire parallel to the cut plane, material of the grounding wire is spread over the cut side surfaces of the substrate.

6. The device according to claim 1,
wherein the grounding wire is electrically connectable to an electrical ground located external to the semiconductor device through an external connection terminal.

7. The device according to claim 1,
wherein the wiring layer includes:
a first wiring layer provided on the upper surface of the substrate,
a second wiring layer provided on a lower surface of the substrate, and
a third wiring layer provided between the first wiring layer and the second wiring layer,
wherein the third wiring layer includes the grounding wire.

8. A semiconductor device, comprising:
a wiring board having at least one semiconductor chip physically connected to a first surface thereof and a resin layer disposed over and sealing the at least one semiconductor chip and adjacent surfaces of the wiring board, and at least one wiring layer having a cross sectional area, the wiring layer extending to, and exposed at, a side surface of the wiring board, the wiring layer comprising at least one conductive metal:
a conductive layer located over the resin layer, the side surface of the wiring board and the conductive metal of the wiring layer;
the conductive metal of the wiring layer spreading over the side surface of the wiring board outwardly of the cross sectional area of the wiring layer inward of the side surface of the wiring board, wherein the wiring layer includes a first metal material and a second metal material, the second metal material contacting at least a portion of the first metal material; and
the second metal material spreads over the side surface of the wiring board.

9. The semiconductor device of claim 8, wherein the second metal material has a higher resistance to oxidation than the first metal material.

10. The semiconductor device of claim 8, wherein the second metal material is more ductile than the first metal material.

11. The semiconductor device of claim 8, wherein the wiring layer includes a grounding wire that is electrically connectable to an electrical ground located external to the semiconductor device through an external connection terminal.

* * * * *